US008927420B2

(12) United States Patent
Liou et al.

(10) Patent No.: US 8,927,420 B2
(45) Date of Patent: Jan. 6, 2015

(54) MECHANISM OF FORMING SEMICONDUCTOR DEVICE HAVING SUPPORT STRUCTURE

(71) Applicant: Taiwan Semiconductor Manufacturing Company Limited, Hsin-Chu (TW)

(72) Inventors: Joung-Wei Liou, Zhudong Town (TW); Keng-Chu Lin, Chao-Chou Ping-Tung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/757,949

(22) Filed: Feb. 4, 2013

(65) Prior Publication Data

US 2014/0217589 A1     Aug. 7, 2014

(51) Int. Cl.
  *H01L 21/4763*  (2006.01)
  *H01L 21/44*  (2006.01)
  *H01L 23/52*  (2006.01)
  *H01L 21/768*  (2006.01)

(52) U.S. Cl.
  CPC .......... *H01L 23/52* (2013.01); *H01L 21/76841* (2013.01)
  USPC ........... 438/643; 438/627; 438/653; 438/618; 438/622; 438/639; 438/637; 438/372

(58) Field of Classification Search
  USPC ......... 438/627, 643, 653, 927, 618, 622, 623, 438/639, 637, 672, 687
  See application file for complete search history.

(56) References Cited

U.S. PATENT DOCUMENTS

| 6,846,515 | B2 | 1/2005 | Vrtis et al. |
| 7,858,519 | B2 | 12/2010 | Liu et al. |
| 2007/0045853 | A1* | 3/2007 | Myung .......................... 257/762 |
| 2009/0189243 | A1* | 7/2009 | Lim et al. ...................... 257/506 |
| 2012/0074535 | A1 | 3/2012 | Huang et al. |
| 2012/0270379 | A1 | 10/2012 | Lai et al. |

OTHER PUBLICATIONS

"Back end of Line", http://en.wikipedia.org/wiki/BEOL, pp. 1-2, Published Sep. 13, 2006.
"Front of the Line", http://en.wikipedia.org/wiki/FEOL, pp. 1-2, Published Sep. 13, 2006.

\* cited by examiner

*Primary Examiner* — Matthew Reames
*Assistant Examiner* — Dilinh Nguyen
(74) *Attorney, Agent, or Firm* — Cooper Legal Group, LLC

(57) ABSTRACT

Among other things, one or more support structures and techniques for forming such support structures within semiconductor devices are provided. The support structure comprises an oxide infused silicon layer that is formed within a trench of a dielectric layer on a substrate of a semiconductor device. The oxide infused silicon layer results from a silicon layer that is exposed to oxide during an ultraviolet (UV) curing process. The oxide infused silicon layer is configured to support a barrier layer against a conductive structure formed on the barrier layer within the trench. In this way, the support structure provides pressure against the barrier layer so that the barrier layer substantially maintains contact with the conductive structure, to promote improved performance and reliability of the conductive structure.

20 Claims, 8 Drawing Sheets

MECHANISM OF FORMING SEMICONDUCTOR DEVICE HAVING SUPPORT STRUCTURE

BACKGROUND

Semiconductor fabrication can comprise a front-end-of-line process where, for example, one or more electrical devices, such as transistors, capacitors, resistors, etc., are patterned onto a semiconductor wafer. Semiconductor fabrication can comprise a back-end-of-line process where, for example, electrical devices are interconnected on the semiconductor wafer.

DETAILED DESCRIPTION

Figure 1:
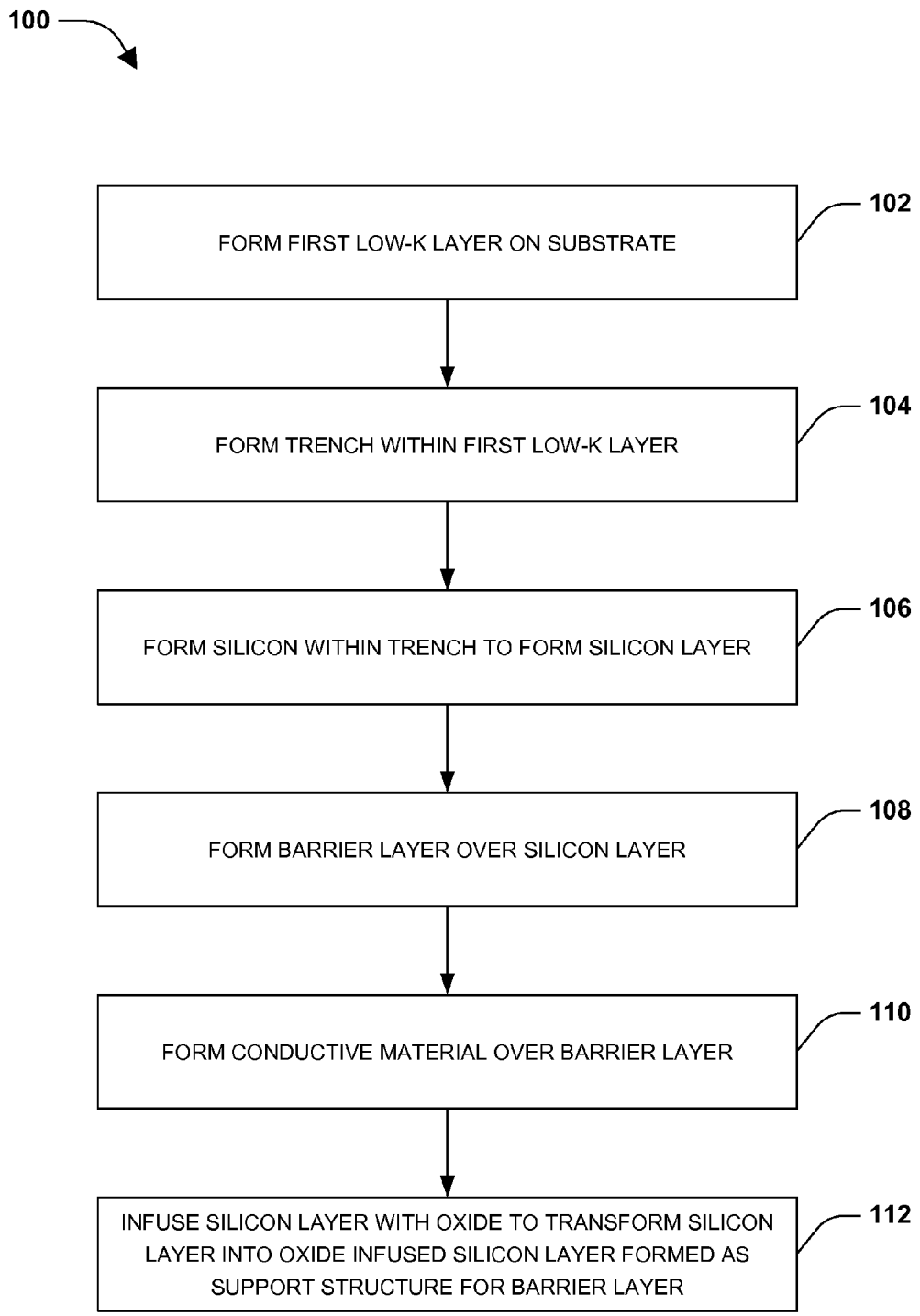
FIG. 1 is a flow diagram illustrating a method of forming a support structure within a semiconductor device, according to some embodiments.
Figure 2:
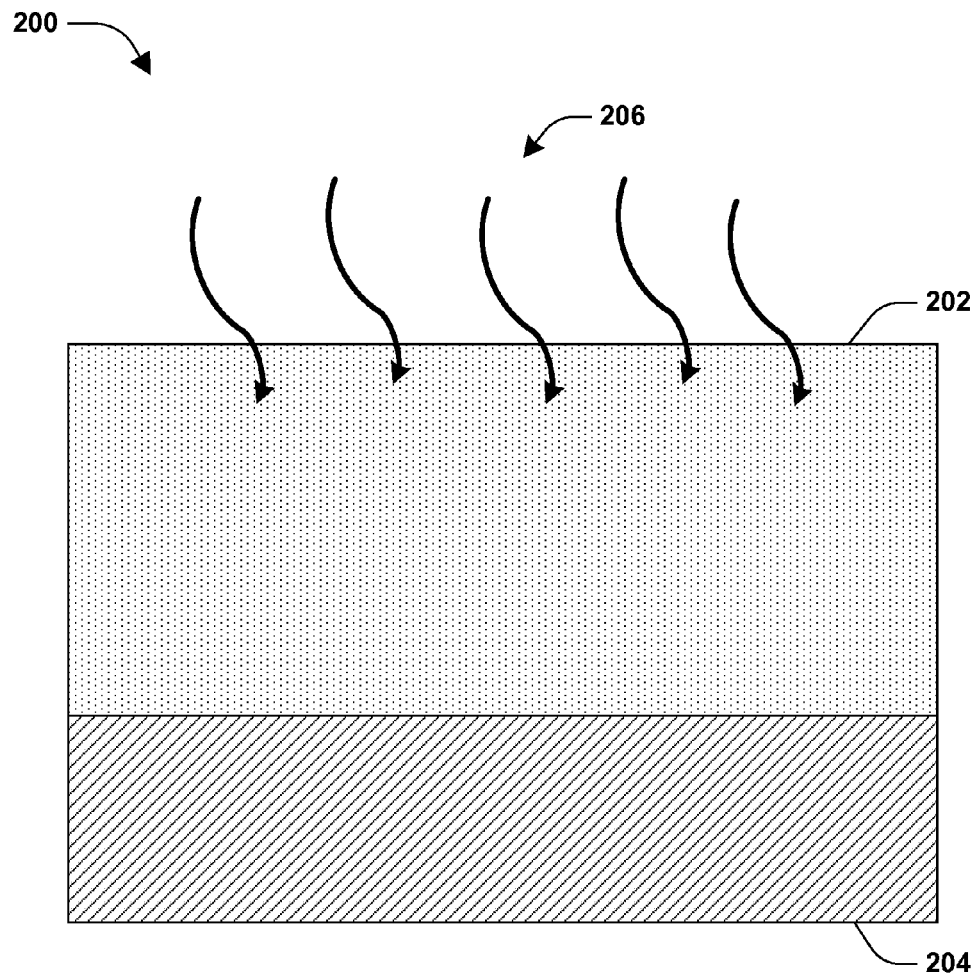
FIG. 2 is an illustration of a semiconductor device on which a support structure is to be formed, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more support structures and one or more techniques for forming such support structures within semiconductor devices, such as during a back-end-of-line process, for example, are provided herein. That is, a support structure is formed within a semiconductor device between a dielectric layer, such as a low-k layer, and a barrier layer that generally envelops a conductive structure, such as a copper via. The support structure is configured to support or maintain the barrier layer substantially against the conductive structure so that shrinkage of the low-k layer resulting from a ultraviolet (UV) curing process does not result in the barrier layer pulling away from the conductive structure, or results in the barrier layer pulling away or separating from the conductive structure to a lesser degree than if the support structure was not present. Without support from the support structure, separation of the barrier layer from the conductive structure is more likely to occur, where such pulling away results in decreased performance and operational longevity of the conductive structure.

By way of example, in a back-end-of-line process, a UV curing process is used to modify properties of dielectric material, such as a low-k layer, formed on the semiconductor wafer. The UV curing process, for example, strengthens, hardens, or improves a k value of the low-k layer. In some embodiments, the low-k layer has a low dielectric constant (k value), such as a value of about 3.8 or below. In some embodiments, the low-k layer has a k value of about 3.0 or below. In some embodiments, the low-k layer has a k value of about 2.5 or below. The low-k layer is, in some embodiments, further characterized or classified as ultra low-K (ULK), extra low-K (ELK), or extreme low-k (XLK), where the classification is generally based upon the k value. For example, ULK generally refers to materials with a k value of between about 2.7 to about 2.4, ELK generally refers to materials with a k value of between about 2.3 to about 2.0, and XLK generally refers to materials with a k value of less than about 2.0. In some embodiments, the low-k layer comprises carbon, hydrogen, oxygen, or combinations thereof. By way of further example, and not limitation, the low-k layer comprises spin-on glass (SOG), fluorinated silica glass (FSG), organosilicate glass, porogen-containing material(s), carbon doped silicon oxide (e.g., SiCOH), Black Diamond®. (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric material(s), other suitable dielectric material(s), or combinations thereof. In some embodiments, the low-k layer comprises one or more dopants. As with other structures, features, elements, layers, etc. provided herein, the low-k layer is formed by any suitable process, such as spin-on coating, chemical vapor deposition (CVD), atomic layer deposition (ALD), high density plasma CVD (HPCVD), low pressure CVD (LPCVD), metal organic CVD (MOCVD), remote plasma CVD (RPCVD), plasma enhanced CVD (PECVD), high density plasma (HDP) process, high aspect ratio process (HARP), or other suitable processes, or combinations thereof. It is understood that, in some embodiments, the low-k layer comprises one or more dielectric materials and additionally or alternatively one or more dielectric layers.

The UV curing process also, however, results in the low-k layer shrinking, which, in some instances, alters a special relationship between other layers of the semiconductor device, such as a barrier layer between the low-k layer and the conductive structure. For example, when the low-k layer shrinks or contracts, the barrier layer is pulled away from the conductive structure based upon a relatively higher adhesion between the barrier layer and the low-k layer as opposed to adhesion between the barrier layer and the conductive structure. Separation between the barrier layer and the conductive structure, in some instances, results in performance and reliability degradation of the conductive structure. Accordingly, a support structure and formation thereof are provided herein, where the support structure serves to maintain, at least to a greater degree than if the support structure was not present, the barrier layer against the conductive structure.

A method 100 of forming a support structure within a semiconductor device, according to some embodiments, is illustrate in FIG. 1, and one or more support structures formed by such a methodology are illustrated in FIGS. 2-7B. At 102, a first dielectric layer, such as a first low-k layer 202, is formed on a substrate 204 of a semiconductor device, as illustrated in example 200 of FIG. 2. For example, low-k material is deposited onto a substrate to form the first low-k layer 202. In an example, an initial UV curing process 206 is performed to modify the first low-k layer 202, such as to increase a strength such as a resistance to deform under stress, a hardness, or k value of the first low-k layer 202. In some embodiments, the initial UV curing process 206 has, or is performed at, at least one of a wavelength between about 200 nm to about 400 nm, a temperature between about 200° C. to about 500° C., a pressure between about 1 Torr to about 100 Torr, or an exposure time between about 30 seconds to about 10 minutes. In some embodiments, a temperature less than about 500° C., such as a temperature between about 200° C. and about 400° C., is used during the initial UV curing process 206.

Figure 3:
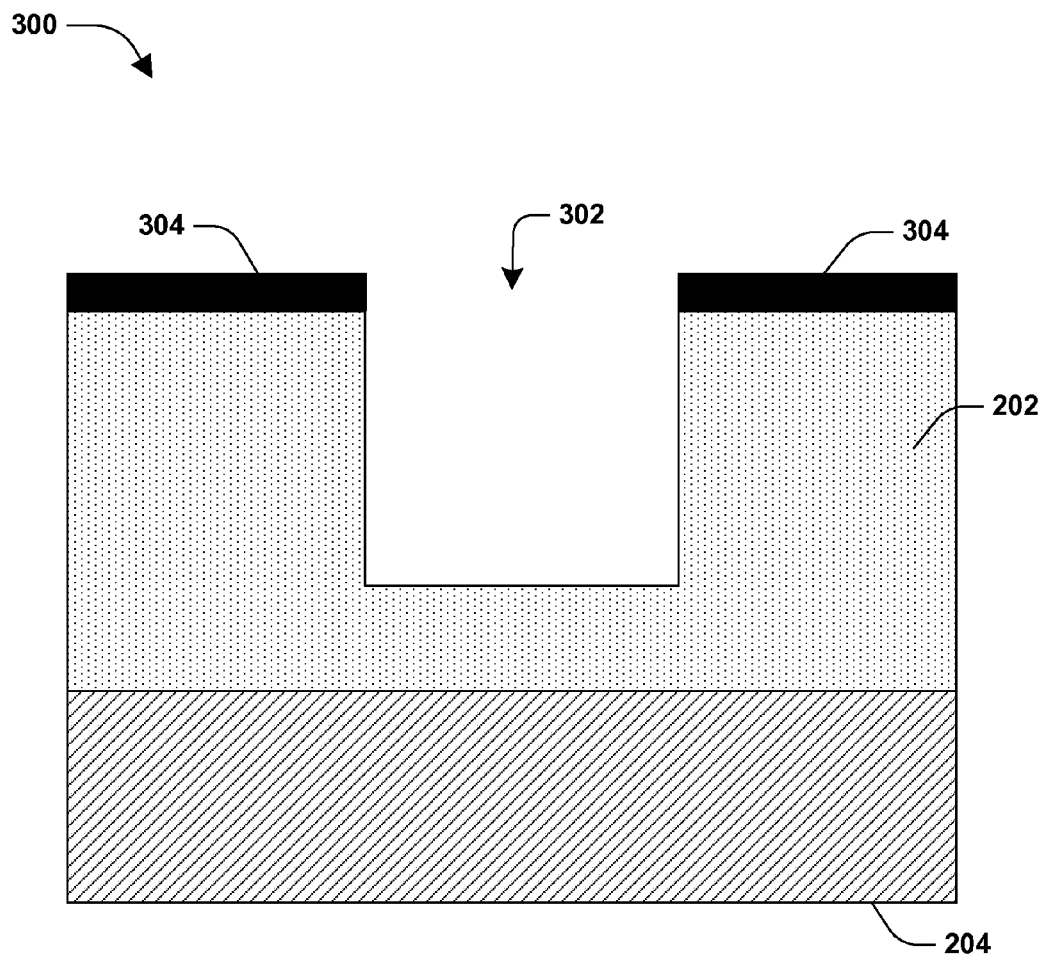
FIG. 3 is an illustration of a semiconductor device on which a support structure is to be formed, according to some embodiments.
Figure 4:
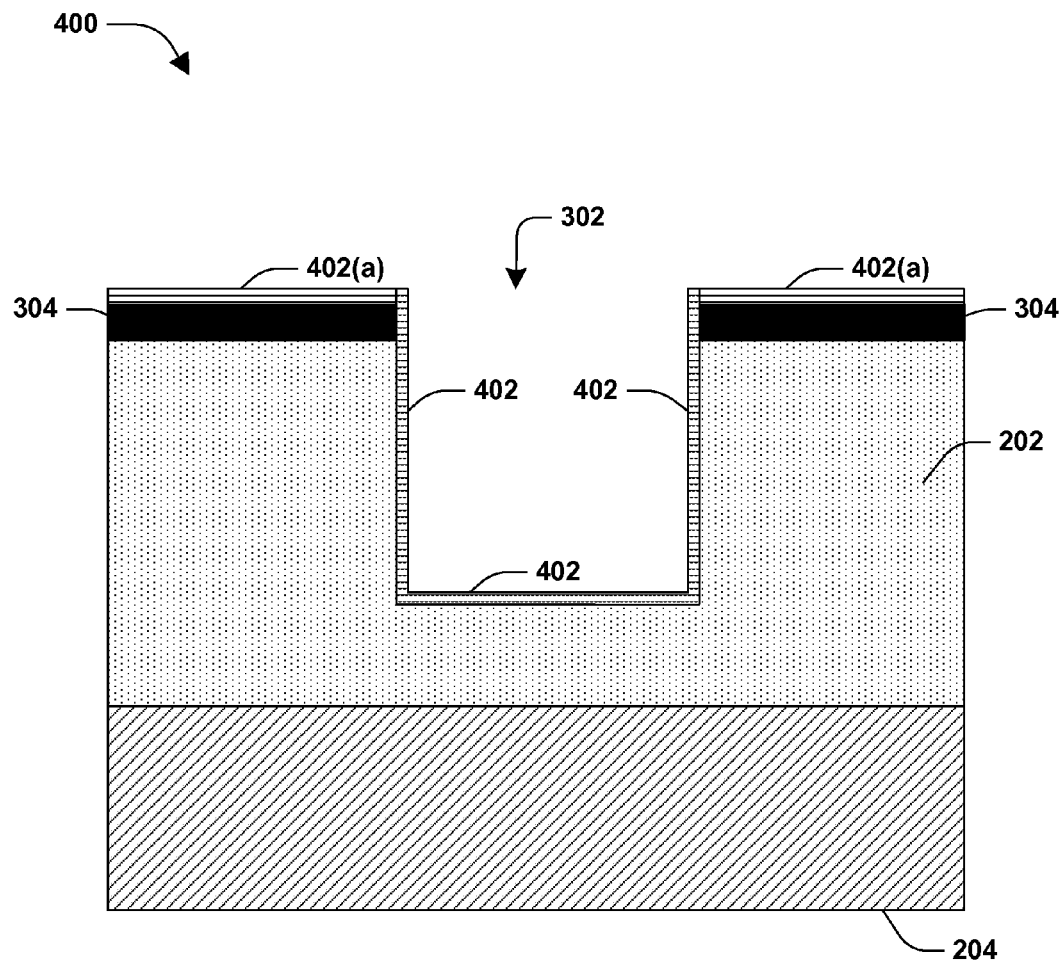
FIG. 4 is an illustration of a semiconductor device on which a support structure is to be formed, according to some embodiments.

At 104, a trench 302 is formed within the first low-k layer 202, as illustrated in example 300 of FIG. 3. The trench 302 is formed to accommodate a subsequently formed conductive structure, such as a cooper via. In some embodiments, a hardmask 304 is used during a trench formation process, such as an etch process, used to form the trench 302, so that desired portions of the low-k layer 202, such as portions not corresponding to the trench 302, are not removed by the etch process. At 106, silicon or silicon based material is formed within the trench 302 to form a silicon layer 402, as illustrated in example 400 of FIG. 4. In some embodiments, the silicon layer 402 lines the trench 302, such as lining a bottom portion of the trench 302 and at least one sidewall of the trench 302. In some embodiments, the silicon layer 402 lines the trench 302 and is formed as an upper silicon layer 402a on a top portion of the hardmask 304 that is residual from the trench formation process. In an example, the hardmask 304 and the upper silicon layer 402a are removed. In some embodiments, the silicon layer 402 is formed using a deposition process that deposits silicon, such as through a chemical vapor deposition or an atomic layer deposition process, at a temperature that is less than about 500° C., such as a temperature between about 200° C. and about 400° C., resulting in the silicon layer 402 comprising a thickness of between about 5 A to about 100 A. In some embodiments, a mask is used to cover portions of the semiconductor device that are not to have silicon formed thereon, such as portions of the low-k layer 202 that do not form the trench 302.

Figure 5:
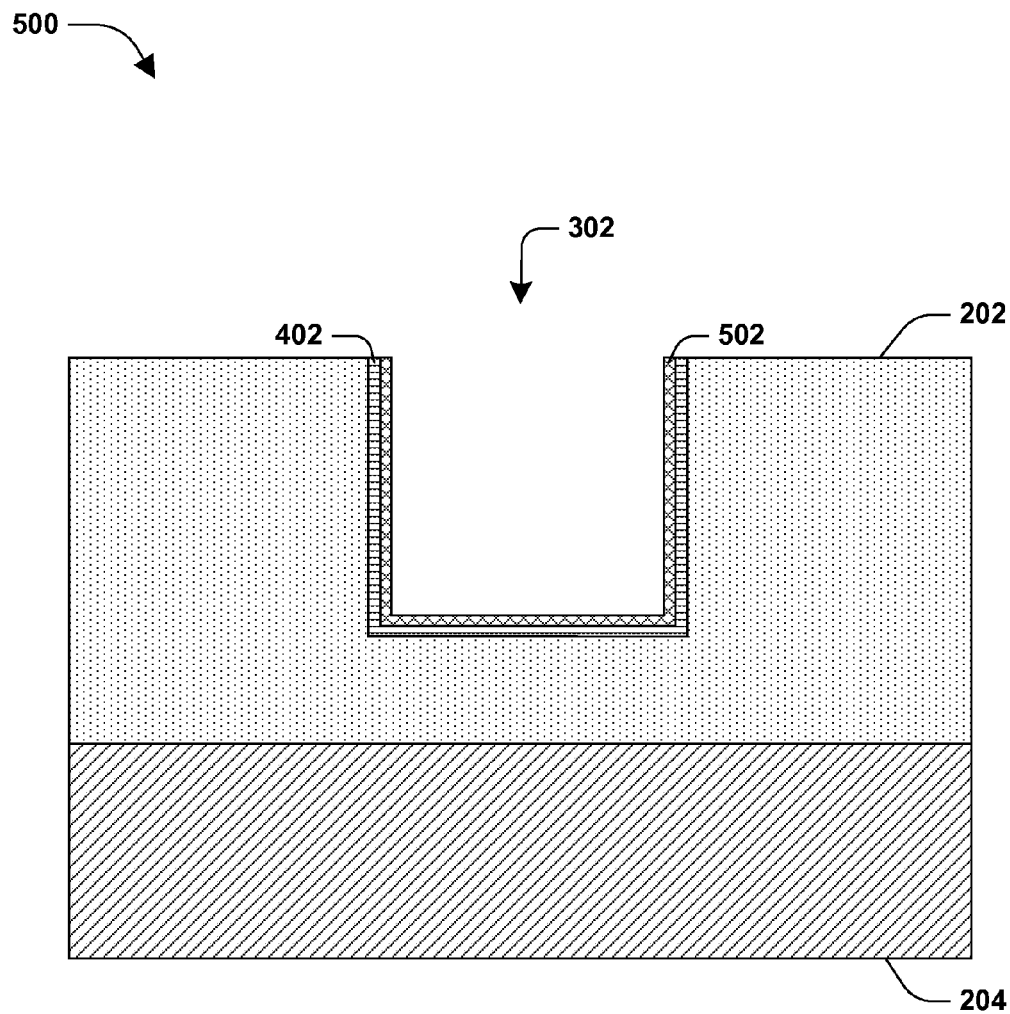
FIG. 5 is an illustration of a semiconductor device on which a support structure is to be formed, according to some embodiments.

At 108, a barrier layer 502 is formed over the silicon layer 402, as illustrated in example 500 of FIG. 5. In some embodiments, the barrier layer 502 forms a liner over the silicon layer 402, such as along a bottom portion of the trench 302 and at least one sidewall of the trench 302. In some embodiments, the barrier layer 502 is formed using a deposition process that deposits a dielectric material, such as titanium-nitride, for example, such as through a chemical vapor deposition (CVD) process, a plasma-etch (PECVD) process, or an atomic layer deposition (ALD) process, at a temperature that is less than about 500° C., such as a temperature between about 200° C. and about 400° C., resulting in the barrier layer 502 comprising a thickness of between about 5 A to about 100 A. In some embodiments, a mask is used to cover portions of the semiconductor device that are not to have dielectric material formed thereon, such as portions of the low-k layer 202 that do not form the trench 302.

CVD is a thin film deposition technique that exposes a substrate to one or more precursor chemicals. The one or more precursor chemicals react and decompose on a surface of the substrate, resulting in a deposition of a material. PECVD utilizes plasma to enhance the rate at which the one or more precursor chemicals react. In an example, PECVD allows for deposition of the material at a temperature that is relatively lower than a temperate of CVD.

ALD is a thin film deposition technique that deposits successive layers of one or more source materials, such as source gases, to produce a layered film having a relatively uniform thickness. That is, ALD is a conformal process resulting in the layered film having relatively uniform thickness as compared with other deposition techniques. In some embodiments, ALD involves one or more source materials, such as silane (SiH4) or Tetrafluorosilane (SiF4), that are used in sequential reactions within a reaction chamber to form the layered film. In some embodiments of ALD utilizing multiple source materials, a first source material is exposed in a first reaction to create a first layer, such as a relatively thin layer, on a wafer. The reaction chamber is then purged to remove contaminates or leftover particles from the first reaction. Then a second source material is exposed in a second reaction to form a second layer over the first layer. In this way, one or more layers are sequentially deposited on the wafer. In some embodiments of ALD utilizing a single source material, one or more deposition sequences are performed using a source gas, such as silane (SiH4), Tetrafluorosilane (SiF4), or other source gas. For example, a deposition sequence comprises a first SiH4 pulse, a first radio frequency (RF) sputtering on phase, a second SiH4 pulse, and a second RF sputter on phase. During an RF sputtering on phase, an RF power source is turned on, such that radio waves are transmitted through a material, resulting in ionization of gas atoms. Once the ion gas atoms contact a material that is to be deposited, the material is broken into one or more pieces that form a thin film on a surface of a substrate.

Figure 6:
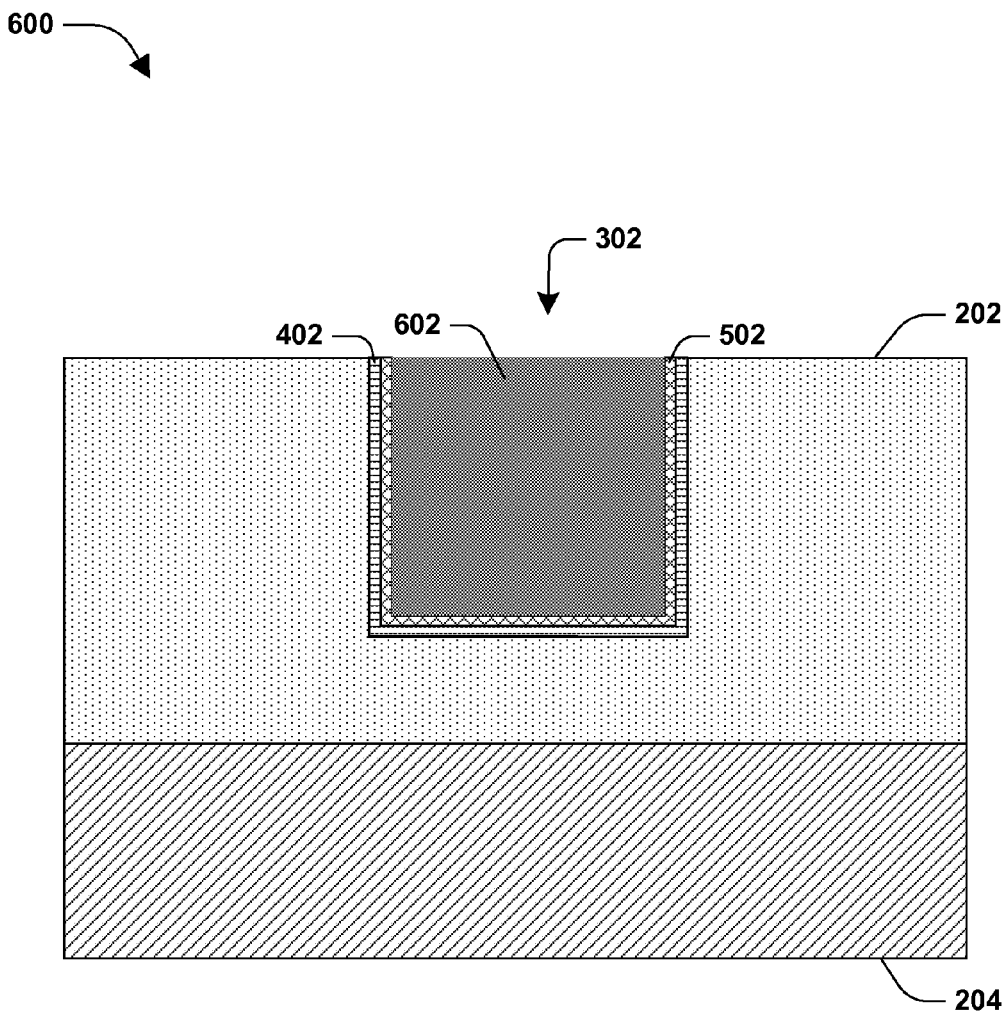
FIG. 6 is an illustration of a semiconductor device on which a support structure is to be formed, according to some embodiments.

At 110, conductive material is formed over the barrier layer 502 within the trench 302 to create a conductive structure 602, as illustrated in example 600 of FIG. 6. In some embodiments, the conductive structure 602 comprises a conductive material, such as metal. For example, an electrochemical plating process is used to form the conductive structure 602 from copper. In some embodiments, the conductive structure 602 comprises a height of between about 500 A to about 1000 A and a width of between about 300 A to about 1000 A. In some embodiments, a chemical mechanical polishing process is performed to polish off residual conductive material, such as conductive material remaining on top of the low-k layer 202, to promote uniformity along a top surface of the layers. In some embodiments, an etch stop layer 752 is formed over the trench 302 and materials formed therein, and a second low-k layer 754 is formed on the etch stop layer 752, as illustrated in example 750 of FIG. 7B.

Figure 7A:
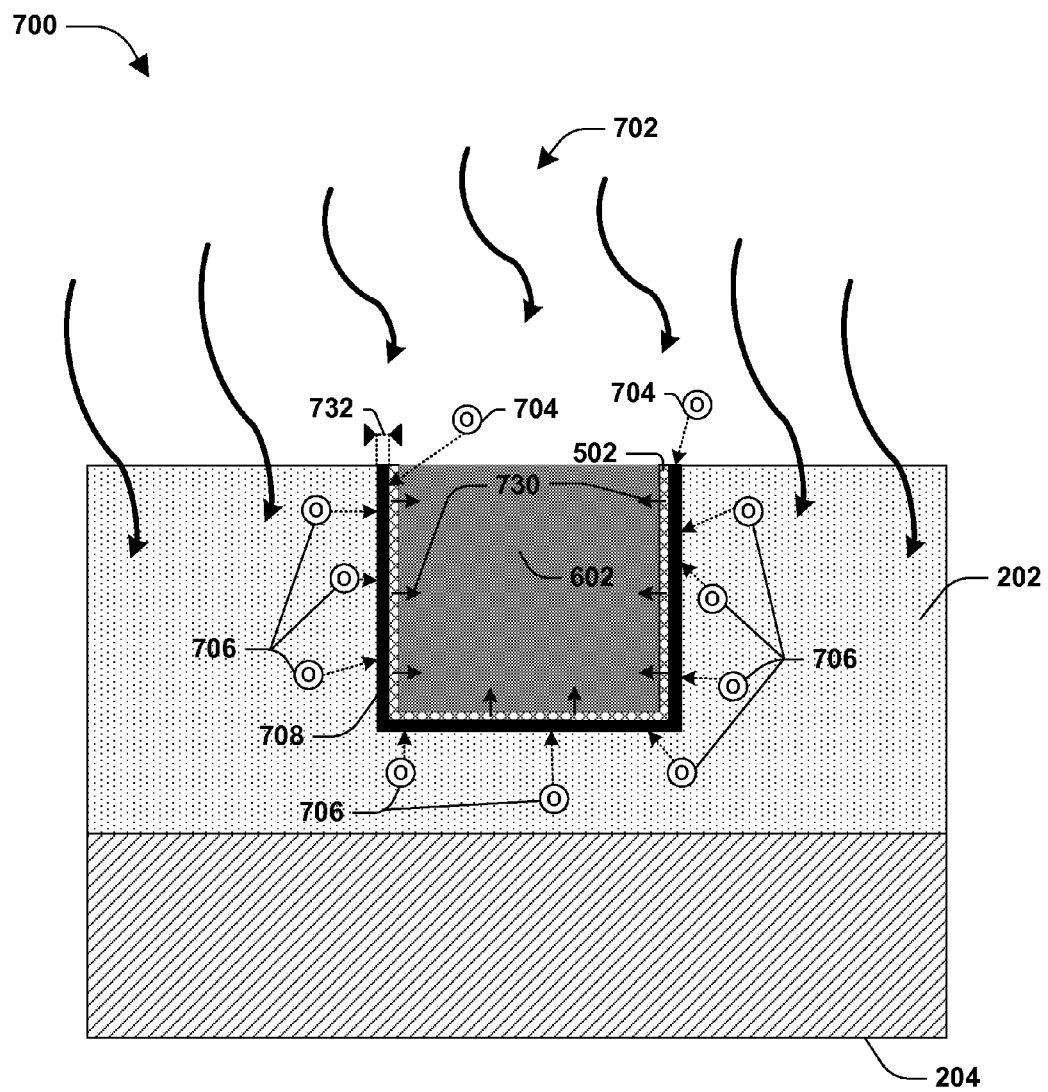
FIG. 7A is an illustration of a support structure, according to some embodiments.

At 112, the silicon layer 402 is infused with oxide to transform the silicon layer 402 into an oxide infused silicon layer 708 formed as a support structure for the barrier layer 502, as illustrated in example 700 of FIG. 7A. In one embodiment, the oxide infused silicon layer 708 comprises SiOx, where x is between about 1 and about 2. In another embodiment, the oxide infused silicon layer 708 comprises oxide-rich silicon. In another embodiment, the oxide infused silicon layer 708 comprises varying levels of oxygen, such as relatively high concentrations of oxygen in portions closer to the first low-k layer 202 because oxygen is infused from the first low-k layer 202 into the silicon layer 402. In some embodiments, the oxide infused silicon layer 708 is distinguishable from a low-k layer 202 because the oxide infused silicon layer 708 does not comprise dopants, such as carbon, hydrogen, fluorine, or other dopants, that are comprised within a low-k material. That is, the low-k material comprises dopants that are not silicon or oxygen. In this way, the oxide infused silicon layer 708 is structurally different than a low-k layer 202 because the oxide infused silicon layer 708 comprises silicon and oxygen but no dopants, whereas the low-k layer 202 comprises dopants that are not silicon or oxygen.

The support structure is configured to support the barrier layer 502 substantially against the conductive structure 602, such as during an ultraviolet (UV) curing process 702 that causes the first low-k layer 202 to shrink, in some instances. Without the support structure, the shrinking of the low-k layer 202 causes separation between the barrier layer 502 and the conductive structure 602, in some instances. Due to support from the support structure, however, contact between the barrier layer 502 and the conductive structure 602 is substantially maintained based upon pressure provided by the support structure 708. In some embodiments, the silicon layer 402 is exposed to oxygen, such as ambient oxygen 704 or oxygen 706 from the first low-k layer 202, during the UV curing process 702 to form the oxide infused silicon layer 708. The oxide infused silicon layer 708 comprises silicon oxide, such as silicon dioxide, silicon trioxide, oxide-rich silicon, etc. In some embodiments, the oxide infused silicon layer 708 comprises a thickness 732 of between about 5 A to about 100 A. In some embodiments, the oxide infused silicon layer 708 comprises silicon oxide having a density that is relatively greater than a density of the silicon layer 402 before infusion of the oxide.

Figure 7B:
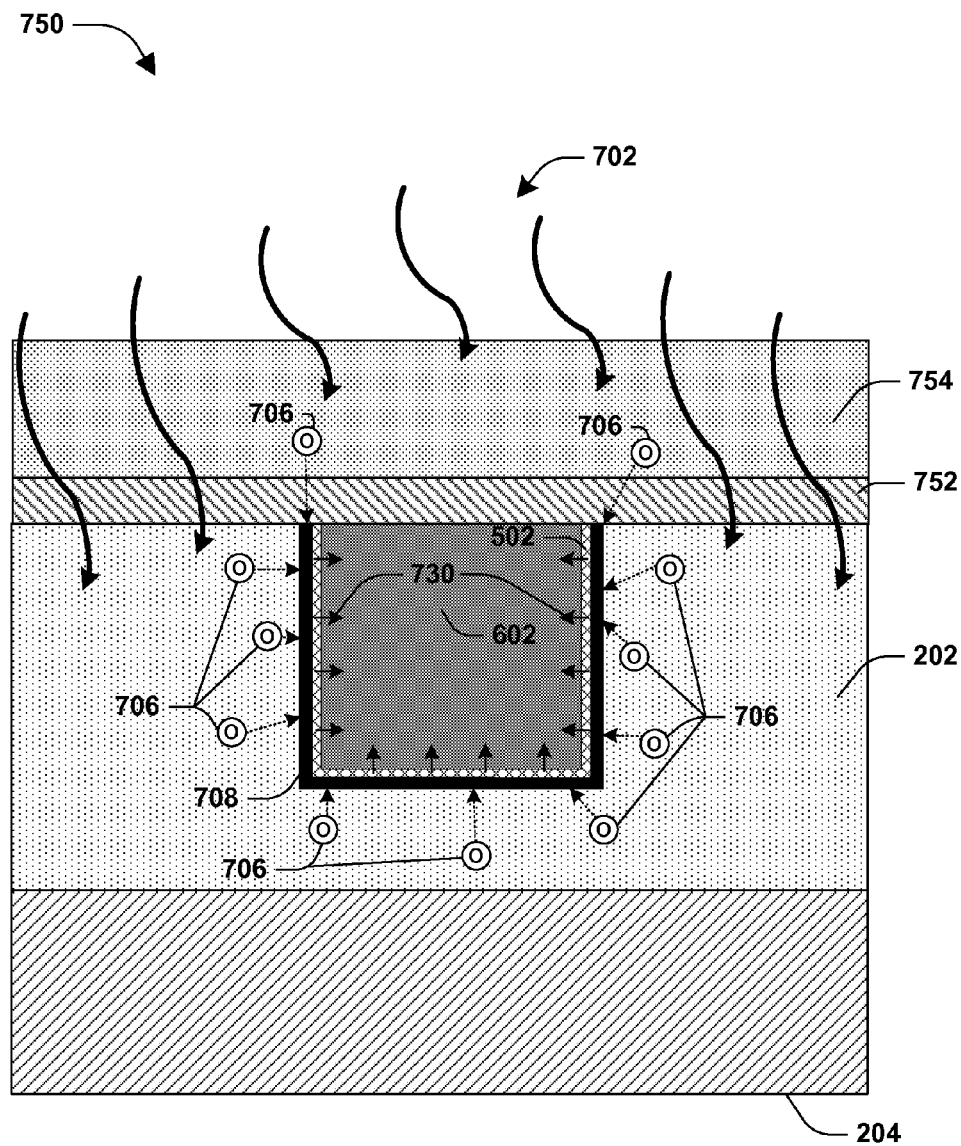
FIG. 7B is an illustration of a support structure, according to some embodiments.

In some embodiments, the silicon layer 402 is infused with oxide during the UV curing process 702 of the second low-k layer 754 that is formed on top of the etch stop layer 752, as illustrated in example 750 of FIG. 7B. For example, the UV curing process 702 is performed to modify the second low-k layer 754, such as increasing a strength, hardness, or k value of the second low-k layer 754. During the UV curing process 702, at least some of the UV radiation penetrates the first low-k layer 202, resulting in the first low-k layer 202 shrinking. The oxide infused silicon layer 708, and increased density thereof, functions as a support structure by providing pressure against the barrier layer 502, as indicated by arrows 730 in FIGS. 7A and 7B, so that the barrier layer 502 substantially remains in contact with the conductive structure 602 during and after the UV curing process 702.

According to an aspect of the instant disclosure, a semiconductor device with a support structure for a barrier layer associated with a conductive structure is provided. The semiconductor device comprises a first low-k layer formed on a substrate. The first low-k layer comprises a trench formed therein. The semiconductor device comprises a support structure comprising oxide infused silicon that is formed within the trench. The semiconductor device comprises a barrier layer that is formed on the support structure within the trench. The barrier layer comprises a dielectric material. The semiconductor device comprises a conductive structured formed on the barrier layer within the trench. The support structure is configured to provide pressure against the barrier layer so that the barrier layer substantially maintains in contact with the conductive structure so that performance and reliability of the conductive structure is enhanced.

According to an aspect of the instant disclosure, a support structure for supporting a barrier layer substantially against a conductive structure is provided. The support structure comprises an oxide infused silicon layer formed within a trench of a dielectric layer, such as a low-k layer, on a substrate of a semiconductor device. The oxide infused silicon layer comprises a silicon layer exposed to oxygen during an ultraviolet (UV) curing process. The oxide infused silicon layer is configured to support a barrier layer substantially against a conductive structure formed on the barrier layer within the trench.

According to an aspect of the instant disclosure, a method for forming a support structure within a semiconductor device is provided. The method comprises, forming a first low-k layer on a substrate of the semiconductor device. A trenched is formed within the first low-k layer. Silicon is formed within the trench to form a silicon layer lining a bottom portion and at least one sidewall of the trench. A barrier layer is formed over the silicon layer. The barrier layer comprises dielectric material. A conductive material is formed over the barrier layer within the trench to create a conductive structure, such as a via. The silicon layer is infused with oxide, such as during an ultraviolet (UV) curing process, to transform the silicon layer into an oxide infused silicon layer formed as a support structure for the barrier layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for forming a support structure within a semiconductor device, comprising:
    forming a first low-k dielectric layer over a substrate of a semiconductor device;
    forming a trench within the first low-k dielectric layer;
    forming silicon within the trench to form a silicon layer over a bottom portion and at least one sidewall of the trench;
    forming a barrier layer over the silicon layer, the barrier layer comprising a dielectric material;
    depositing a conductive material over the barrier layer within the trench to form a conductive structure; and
    infusing the silicon layer with oxygen from an oxygen source to transform the silicon layer into an oxygen infused silicon layer formed as a support structure for the barrier layer.

2. The method of claim 1, the infusing the silicon layer comprising:
    exposing the silicon layer to the oxygen from the oxygen source during an ultraviolet (UV) curing process, the oxygen source comprising least one of the first low-k dielectric layer or ambient oxygen.

3. The method of claim 1, the oxygen infused silicon layer comprising SiOx, where (x) is 1 or 2.

4. The method of claim 1, the infusing the silicon layer comprising:
    exposing the silicon layer to the oxygen from the oxygen source to increase a density of the silicon layer, resulting in the oxygen infused silicon layer having a density that is greater than a density of the silicon layer before the exposing.

5. The method of claim 1, comprising:
    forming an etch stop layer over the trench; and
    forming a second low-k dielectric layer over the etch stop layer.

6. The method of claim 5, comprising:
    performing an ultraviolet (UV) curing process to increase a k value of the second low-k dielectric layer.

7. The method of claim 1, the infusing the silicon layer comprising:
    forming the oxygen infused silicon layer in relation to the barrier layer such that the oxygen infused silicon layer applies pressure to the barrier layer towards the conductive structure.

8. The method of claim 1, the forming a first low-k dielectric layer comprising:
    forming the first low-k dielectric layer with one or more dopants, the one or more dopants not comprising silicon or oxide.

9. A method for forming a support structure within a semiconductor device, comprising:
    forming a first dielectric layer over a substrate of a semiconductor device;
    forming a trench within the first dielectric layer;
    forming a support structure lining at least a portion of the trench, comprising:
        exposing a silicon layer lining the at least a portion of the trench to oxygen from an oxygen source to infuse the silicon layer with the oxygen;
    forming a barrier layer over the support structure, the barrier layer comprising a dielectric material; and
    depositing a conductive material over the barrier layer within the trench to form a conductive structure.

10. The method of claim 9, the oxygen source comprising ambient oxygen.

11. The method of claim 9, the oxygen source comprising the first dielectric layer.

12. The method of claim 9, the exposing comprising:
    infusing the silicon layer with the oxygen during a curing process.

13. The method of claim 9, the forming a first dielectric layer comprising:
    forming the first dielectric layer with one or more dopants, the one or more dopants not comprising silicon or oxide.

14. The method of claim 9,
    the support structure comprising SiOx, where (x) is 1 or 2.

15. The method of claim 9, the forming a support structure comprising:
    forming the support structure in relation to the barrier layer such that the support structure applies pressure to the barrier layer towards the conductive structure.

16. The method of claim 9, comprising
    forming an etch stop layer over the trench; and
    forming a second dielectric layer over the etch stop layer.

17. A method for forming a support structure within a semiconductor device, comprising:
    forming a dielectric layer over a substrate of a semiconductor device;
    forming a trench within the dielectric layer;
    forming silicon within the trench to form a silicon layer over a bottom portion and at least one sidewall of the trench;
    forming a barrier layer over the silicon layer, the barrier layer comprising a dielectric material;
    depositing a conductive material over the barrier layer within the trench to form a conductive structure; and
    exposing the silicon layer to oxygen from an oxygen source during a curing process to create an oxygen infused silicon layer formed as a support structure for the barrier layer.

18. The method of claim 17, the oxygen source comprising the dielectric layer.

19. The method of claim 17, the oxygen source comprising ambient oxygen.

20. The method of claim of claim 17, the exposing the silicon layer comprising:
    forming the oxygen infused silicon layer in relation to the barrier layer such that the oxygen infused silicon layer applies pressure to the barrier layer towards the conductive structure.

* * * * *